(12) United States Patent
Cohen

(10) Patent No.: US 6,610,151 B1  
(45) Date of Patent: Aug. 26, 2003

(54) SEED LAYERS FOR INTERCONNECTS AND METHODS AND APPARATUS FOR THEIR FABRICATION

(76) Inventor: Uri Cohen, 765-53 San Antonio Rd., Palo Alto, CA (US) 94303

(*) Notice: Subject to any disclaimer, the term of this patent is extended or adjusted under 35 U.S.C. 154(b) by 0 days.

(21) Appl. No.: 09/563,733

(22) Filed: May 3, 2000

Related U.S. Application Data (63) Continuation-in-part of application No. 09/410,898, filed on Oct. 2, 1999, now Pat. No. 6,136,707.

(51) Int. Cl.$^7$ ............ C23C 16/00; C23C 14/00; H05H 1/00; H01L 21/44

(52) U.S. Cl. .............. 118/719; 118/695; 118/697; 156/345.32; 204/298.25; 438/687

(58) Field of Search ................ 118/719, 715, 118/695, 697, 698; 156/345.32–345.31; 204/298.25, 298.02; 438/687

(56) References Cited

U.S. PATENT DOCUMENTS

| | | | |
|---|---|---|---|
| 5,173,442 A | 12/1992 | Carey ............ | 437/173 |
| 5,219,787 A | 6/1993 | Carey et al. ........ | 437/187 |
| 5,354,712 A | 10/1994 | Ho et al. .......... | 437/195 |
| 5,403,620 A | 4/1995 | Kaesz et al. ....... | 427/252 |
| 5,612,254 A | 3/1997 | Mu et al. .......... | 437/195 |
| 5,693,563 A | 12/1997 | Teong ............. | 437/190 |
| 6,110,828 A * | 8/2000 | Guo et al. ........ | 438/688 |
| 6,139,697 A * | 10/2000 | Chen et al. ....... | 204/192.15 |
| 6,169,030 B1 * | 1/2001 | Naik et al. ....... | 438/680 |
| 6,197,181 B1 | 3/2001 | Chen | |
| 6,251,242 B1 | 6/2001 | Fu et al. | |
| 6,251,759 B1 * | 6/2001 | Guo et al. ........ | 438/584 |
| 6,274,008 B1 | 8/2001 | Gopalraja et al. | |
| 6,277,249 B1 | 8/2001 | Gopalraja et al. | |
| 6,374,770 B1 | 4/2002 | Lee et al. | |

OTHER PUBLICATIONS

"Biased Directional Sputtering For Barrier And Seed Layers" by S. Mizuno et al., 1999 Proc. 16$^{th}$ Intl VLSI Multilevel Interconn. Conf. (VMIC), Sep. 7–9, 1999, pp. 591–596.

"Copper Barrier Bias–Temperature Stress Tests On Low–k CVD Silicon–Oxide–Based Black Diamond Films" by R. P. Mandal et al., 1999 Proc. 16$^{th}$ Intl VLSI Multilevel Interconn. Conf. (VMIC), Sep. 7–9, 1999, pp. 585–590.

"The Influence Of The Underlayer On The CVD Cu Nucleation" by Y. Qian et al., 1999 Proc. 16$^{th}$ Intl VLSI Multilevel Interconn. Conf. (VMIC), Sep. 7–9, 1999, pp. 558–562.

(List continued on next page.)

*Primary Examiner*—Parviz Hassanzadeh (57) ABSTRACT

An apparatus for depositing seed layers from a group of Cu, Ag or an alloy thereof on a substrate having narrow openings surrounded by a filed; the apparatus comprising a controller, said controller including instructions to deposit a conformal seed layer having a thickness of 50–500 Å oil the filed and to deposit a non-conformal seed layer having a thickness of 100–3000 Å on the filed and to stop depositing the seed layers prior to filling the narrow openings, such that the rermaining narrow openings are filled by electroplating. In accordance with the invention, substantially conformal and non-conformal seed layers me deposited in an apparatus where the conformal and non-conformal seed layer deposition steps can be carried out without breaking vacuum, or without exposing the wafer to the atmosphere between the deposition steps. In another embodiment of the invention, the apparatus comprises a chamber in which both conformal and non-conformal seed layers are deposited utilizing two or more distinct steps, wherein the deposition variables (or conditions) during the first step are suitable for the deposition of a substantially conformal (or a non-conformal) seed layer, and the deposition conditions during the second step are suitable for the deposition of a substantially non-conformal (or a conformal) seed layer.

40 Claims, 4 Drawing Sheets

OTHER PUBLICATIONS

"Gap Filling Electro–Chemical Deposition Technology For Copper Damascene Process" by M. Zhu et al. 1999 Proc. 16th Intl VLSI Multilevel Interconn. Conf. (VMIC), Sep. 7–9, 1999, pp. 541–546.

"Study of Diffusion Barrier Properties of Ionized Metal Plasma (IMP) Deposited TaN Between Cu and $SiO_2$" by Y. K. Lee et al., 1999 Proc. 16th Intl VLSI Multi. Inter. Conf. (VMIC), Sep. 7–9, 1999, pp. 322–324.

"Electromigration Characteristics of Damascene CVD, PVD, and Electroplated Copper Metallization" by H. S. Rathore et al., 1999 Proc. 16th Intl VLSI Multi. Inter. Conf. (VMIC), Sep. 7–9, 1999, pp. 89–92.

"Cu Dual Damascene Integration Issues" by S. Kordic et al., 1999 Proc. 16th Intl VLSI Multilevel Interconn. Conf. (VMIC), Sep. 7–9, 1999, pp. 53–62.

"Implications of damascene topography for electroplated copper interconnects" by M. E. Gross et al., Solid State Tech., Aug. 1999, pp. 47–52.

"Aluminum Persists as Copper Age Dawns" by A. E. Brown, Semi, Intl., Aug. 1999, pp. 58–66.

"Copper Electroplating Enters Mainstream Processing" by A. E. Brown, Semi. Intl., Apr. 1999, pp. 58–66.

"Barriers for copper interconnections" by C. Ryu et al., Solid State Tech., Apr. 1999, pp. 53–56.

"Copper On–Chip Interconnections" by P. C. Andricacos, The Electrochemical Society Interface, Spring 1999, pp. 31–37.

"Barrier Capabilities of Selective Chemical Vapor Deposited W Films and $WSiN/WSi_x/W$ Stacked Layers Against Cu Diffusion" by M. T. Wang et al., J. Electrochemical Soc., vol. 146(2), Feb. 1999, pp. 728–731.

"Tantalum Nitride Films Grown by Inorganic Low Temperature Thermal Chemical Vapor Deposition" by A. E. Kaloyeros et al., J. Electrochemical Soc., vol. 146(1),. Jan. 1999, pp. 170–176.

"Sputtered Cr and Reactively Sputtered $CrN_x$ Serving as Barrier Layers Against Copper Diffusion" by J. C. Chuang et al., J. Electrochemical Soc., vol. 145(12), Dec. 1998, pp. 4290–4296.

"Electroplating bath control for copper interconnects" T. Taylor et al., Sol. St. Tec., Nov. 1998, pp. 47–57.

"Options for CVD of Dielectrics Include low–k Materials" by J. Baliga, Semi. Intl., Jun. 1998, pp. 139–144.

"The Challenges of the Copper CMP Clean" by D. Hymes et al., Semi. Intl, Jun. 1998, pp. 117–122.

"The Environment, Health and Safety Side of Copper Metallization" by L. Mendicino and P. T. Brown, Semi. Intl., Jun. 1998, pp. 105–110.

"Copper has enormous benefits when compared to aluminum, but its implementation requires some fundamental changes in process technologies", by P. Singer, Semi. Intl., Jun. 1998, pp. 91–98.

"Damascene copper electroplating for chip interconnections" P. C. Andricacos et al., IBM Journal of Research & Development, vol. 42, No. 5, 1998.

"The Evolution of Interconnection Technology at IBM" by J. G. Ryan et al., IBM Journal of Research & Development, vol. 39, No. 4, 1995.

"Sputter Deposition Processes" by R. Parsons, pp. 177–208 in *Thin Film Processes II*, Edited by J. L. Vosen and W. Kern, Academic Press (1991).

"The Cathodic Arc Plasma Deposition of Thin Films" by P. C. Johnson, pp. 209–285 in *Thin Film Processes II*, edited by J. L. Vosen and W. Kern, Academic Press (1991).

"Thermal Chemical Vapor Deposition" by K. F. Jensen and W. Kern, pp. 283–368 in *Thin Film Processes II*, edited by J. L. Vosen and W. Kern, Academic Press (1991).

* cited by examiner

Figure 5. SEM of a trench ~0.10μm wide; ~1.4μm deep; AR ~ 14.0:1; Combined barrier and seed layers: ~400-500Å on sidewalls and ~1,800-1,900Å on field. 30° tilt.

Figure 6. SEM of a trench ~0.10μm wide; ~1.4μm deep; AR ~ 14.0:1; Combined barrier and seed layers: ~400-500Å on sidewalls and ~1,800-1,900Å on field. No tilt.

Figure 7

SEED LAYERS FOR INTERCONNECTS AND METHODS AND APPARATUS FOR THEIR FABRICATION

This is a continuation-in-part of a patent application entitled "Seed Layers for Interconnects and Methods for Their Fabrication" which was filed on Oct. 2, 1999, Ser. No. 09/410,898 now U.S. Pat. No. 6,136,707.

TECHNICAL FIELD OF THE INVENTION

The present invention pertains to the field of electroplating metals or alloys for filling high aspect ratio openings, such as trenches and vias, for semiconductor metallization interconnects, thin film heads, or micromachined Microelectromechanical Systems (MEMS) devices. In particular, embodiments of the present invention provide improved seed layers for electroplating copper or silver interconnects in semiconductor devices, and methods and apparatus for fabricating such improved seed layers. The improved seed layers facilitate reliable, void-free filling of small openings with high aspect ratios for so called "Damascene" and "Dual Damascene" copper and/or silver interconnects.

BACKGROUND OF THE INVENTION

As is well known in the prior art, filling trenches and/or vias formed on a wafer by electroplating copper metal to form semiconductor device interconnects (often referred to as a "Damascene" or a "Dual Damascene" process) requires that a metallization layer (often referred to in the art as a seed layer or a base layer) be formed over the wafer surface. As is also well known in the prior art, the seed layer is required: (a) to provide a low-resistance electrical path (to enables uniform electroplating over the wafer surface); (b) to adhere well to the wafer surface (usually to an oxide-containing a dielectric film such as $SiO_2$, $SiO_X$, or $SiO_XN_Y$); and (c) to be compatible with subsequent electroplating copper thereon.

As is. well known, the requirement of providing a low-resistance electrical path is fulfilled by choosing the seed layer to be comprised of an adequately thick, low-resistivity material.

As is further well known, since copper has a rather poor adhesion to oxide surfaces, the requirement of adhering well to the wafer surface is typically fulfilled by disposing an intermediary barrier (or adhesion) metallic layer having a strong affinity for oxygen atoms under the seed layer. As is well known in the prior art, the barrier metallic layer is formed prior to the seed layer to provide good adhesion: (a) to the oxide surface underneath it (the barrier layer provides good adhesion to the oxide surface by sharing oxygen atoms) and (b) to the seed layer above it (the barrier metallic layer provides good adhesion to the seed layer by metal to metal bonds). The barrier layer is often also referred to as an "adhesion layer" or a "liner".In addition to providing good adhesion, the barrier layer also serves to mitigate copper out-diffusion directly into the device, or indirectly (through an insulating or a dielectric layer) into the device. As is well known in the prior art, the barrier layer. is usually chosen from the refractory metals or their alloys, such as for example, Ta, $TaN_X$, Cr, $CrN_X$, Ti, $TiN_X$, W, $WN_X$, and other alloys containing one or more of these materials.

As is still further well known, the requirement of being compatible with electroplating copper is fulfilled by choosing a seed layer that does not react spontaneously (i.e., by displacement) with copper electrolyte used during the electroplating. This is satisfied by requiring that the seed layer does not comprise a metal or alloy that is less noble than copper.

Typically, a seed layer comprises a copper layer that is deposited by a "dry" technique, such as by physical vapor deposition ("PVD"), including but not limited to sputtering, ion plating, or evaporation, or by chemical vapor deposition ("CVD"). However, the seed layer may also be deposited by a "wet" electroless plating process. In such cases, the copper seed layer thickness is typically in a range of about 300 Å to about 2,000 Å on the field (i.e., the top surface of the wafer outside trenches and via openings). In such cases, the barrier layer is typically deposited to a thickness of about 50 Å to about 500 Å (on the field) by either a PVD or a CVD technique.

The PVD techniques include, for example and without limitation, techniques such as evaporation, ion plating, and various sputtering techniques, such as DC and/or RF plasma sputtering, bias sputtering, magnetron sputtering, or Ionized Metal Plasma (IMP) sputtering. As is well known in the art, in general, due to their anisotropic and directional ("line of sight")nature, the PVD techniques produce non-conformal deposition. For a comprehensive description of sputtering techniques and their applications, see for example an article entitled "Sputter .Deposition Processes" by R. Parsons, pp. 177–208 in *Thin Film Processes II*, edited by J. L. Vosen and W. Kern, Academic Press (1991). However, some of the PVD techniques (such as ion plating) may produce, under certain conditions, a relatively more conformal deposition. For a comprehensive description of the ion plating technique and its applications; see for example an article entitled "The Cathodic Arc Plasma Deposition of Thin Films" by P. C. Johnson, pp. 209–285 in *Thin Film Processes II*, edited by J.L. Vosen and W. Kern, Academic Press (1991). The CVD techniques include, for example and without limitation, thermal CVD, Plasma Enhanced CVD ("PECVD"), Low Pressure CVD ("LPCVD"), High Pressure CVD ("HPCVD"), and Metallo Organic CVD ("MOCVD"). For a comprehensive description of CVD techniques and their applications, see for example an article entitled "Thermal Chemical Vapor Deposition" by K. F. Jensen and W. Kern, pp. 283–368 in *Thin Film Processes II*, edited by J. L. Vosen and W. Kern, Academic Press (1991). For example, one precursor used for CVD Cu is Cupraselect™, which precursor is sold by Schumacher, Inc. Another precursor is Cu(II) hexafluoroacetylacetonate. The latter can be reacted with hydrogen gas to obtain high purity copper. As is well known in the art, in general, due to their isotropic and non-directional nature, the CVD and the electroless techniques produce conformal deposition, with substantially uniform thickness over the entire surface, including over the field and the bottom and sidewall surface&s of the openings.

Aspect ratio ("AR")is typically defined as a ratio between a vertical dimension, D (depth), of an opening and its smallest lateral dimension, W (width, or diameter): AR=D/W. Usually, in electroplating metals or alloys to fill patterns having high aspect ratio openings (for example, in an insulator or a dielectric), the electroplating rate inside openings is slower than the rate outside openings (i.e., on the field). Further, the higher the AR of the openings, the slower the electroplating rate is inside. This results in poor or incomplete filling (voids) of high AR openings, when compared with results achieved with low AR openings. To overcome this problem in the prior art, commercial copper electrolytes contain additives that adsorb and locally inhibit (or suppress) growth outside the openings (i.e., on the field). Further, growth inhibition inside the openings is decreased from that achieved outside the openings due to slow replenishment of the additives inside the openings as compared with replenishment of the additives on the field. As a result, the deposition rate inside the openings is faster than outside, thereby facilitating void-free copper fill. Other well known reasons for voids in copper electrofill include discontinuous (or incomplete coverage of) seed layers inside the openings, and pinching-off of opening walls (for example, by overhangs of the top corners) prior to plating.

The openings may consist of vias, trenches, or patterned photoresist. As is well known, in damascene or dual damascene processes, an insulating or a dielectric layer is pattern-etched to form openings therein. Next, a barrier (or an adhesion) metallic layer and a seed layer are deposited over the insulating layer to metallize its field (the surface surrounding openings), as well as the sidewalls and bottom surfaces of the openings. Next, copper electroplating is performed over the entire metallized surface, including the top surface (the field) surrounding the openings, and inside the patterned openings. Finally, excess plated copper overlying the openings and the top surface (the field) of the insulating layer, as well as the barrier and seed layers on the field, are removed, for example, by a mechanical polishing or by a chemical mechanical polishing ("CMP")technique. The end result is copper filled openings (trenches and vias), including bottom and sidewall surfaces lined by the barrier and seed layers. In today's most advanced copper filling processes for trenches and vias, the openings have ARs as high as 5:1 (D=1.25 $\mu$m; W=0.25 $\mu$m). Future trenches and vias openings will likely require W=0.10–0.18 $\mu$m, or narrower, and AR=6:1–15:1, or larger.

As semiconductor device dimensions continue to shrink, there is an ever increasing demand for narrower interconnect cross-sections and, thus, smaller openings and larger aspect ratios (AR) during the copper electrofill. To ensure void-free copper filling, the seed layer inside the openings must completely cover the bottom and the sidewall surfaces inside the openings without discontinuities, or else there will be voids in the copper electrofill. On the other hand, the seed layer must not be so thick on the sidewalls that it pinches-off the very narrow openings and should not overhang the top corners of the openings so that it pinches-off the very small openings. Similarly, the barrier layer must also be continuous inside the openings. In contrast to these requirements with respect to the openings, the seed layer must be sufficiently thick on the top surface (the field) to provide a low-resistive electrical path that facilitates uniform plating across the surface of the wafer. That is, the seed layer must be sufficiently thick (for example, a Cu seed layer should preferably be at least about 1,000 Å) on the field to avoid radial non-uniformity across the wafer caused by a voltage (or IR) drop between a contact at the edge of the wafer to the center of the wafer. Any voltage drop (and resulting non-uniformity therefrom) becomes more severe as the resistance of the seed layer increases due to high resistivity and/or insufficient thickness. To ensure a sufficiently low-resistance seed layer, it is now common to deposit a copper seed layer to a thickness of about 1,000 Å to about 2,000 Å on the top surface (field) by a PVD technique. On the other hand, the typical thickness of about 300 Å to about 1,000 Å (on the field), deposited by the CVD techniques, may not be sufficient.

However, neither of these techniques satisfies all of the above-identified requirements. The non-conformal PVD techniques, while providing adequate thickness on the field, fail to provide continuous and complete step coverage inside very narrow openings with large AR. They also result substantial overhangs at the top corners of the openings. The conformal CVD or electroless techniques, on the other hand, while providing continuous and complete step coverage of the seed layer inside very narrow openings, pinch-off the small openings when used at thicknesses required on the field for a low-resistance electrical path. As a result, typical conformal CVD or electroless seed layers are too thin on the field and too thick inside the very narrow openings.

As one can readily appreciate from the above, a need exists in the art for a method and apparatus to produce a continuous seed layer on the sidewalls and bottom of the openings, while maintaining sufficient thickness on the field to facilitate void-free copper electrochemical filling of very narrow openings having high aspect ratios.

SUMMARY OF THE INVENTION

Embodiments of the present invention advantageously satisfy the above-identified need in the art and provide a method and apparatus to produce seed layers used to produce void-free copper or silver electrochemical filling of small openings having high aspect ratios.

One embodiment of the present invention is a method for making metallic interconnects comprising: (a) forming a patterned insulating layer on a substrate, the patterned insulating layer including at least one opening and a field surrounding the at least one opening; (b) depositing a barrier layer over the field and inside surfaces of the at least one opening; (c) depositing a first seed layer over the barrier layer using a first deposition technique; (d) depositing a second seed layer over the first seed layer using a second deposition technique, the first and second deposition techniques being different; and (e) electroplating a metallic layer over the second seed layer, the electroplated metallic layer comprising a material selected from a group consisting of Cu, Ag, or alloys comprising one or more of these metals.

In another embodiment of the invention, a substantially conformal and a substantially non-conformal seed layers are deposited in a single tool, without breaking vacuum, or without exposing the wafer to the atmosphere between the deposition of the two seed layers. The single deposition tool may comprise two or more chambers, at least one chamber for the deposition of the conformal seed layer and at least another chamber for the deposition of the non-conformal seed layer.

In yet another embodiment, a single deposition tool comprises a single chamber in which both the conformal and the non-conformal seed layers are deposited utilizing either: (a) two or more distinct steps, wherein the deposition conditions (or parameters) during the first step are suitable for the deposition of a substantially conformal (or a non-conformal) seed layer and the deposition conditions during the second step are suitable for the deposition of a substantially non-conformal (or a conformal) seed layer, or (b) wherein the deposition conditions are varied continuously or gradually, thereby changing he nature of the seed layer from substantially conformal to substantially non-conformal, or vice versa, or (c) a combination of at least one distinct step and at least one gradual variation of the deposition conditions.

DETAILED DESCRIPTION

Figure 1:
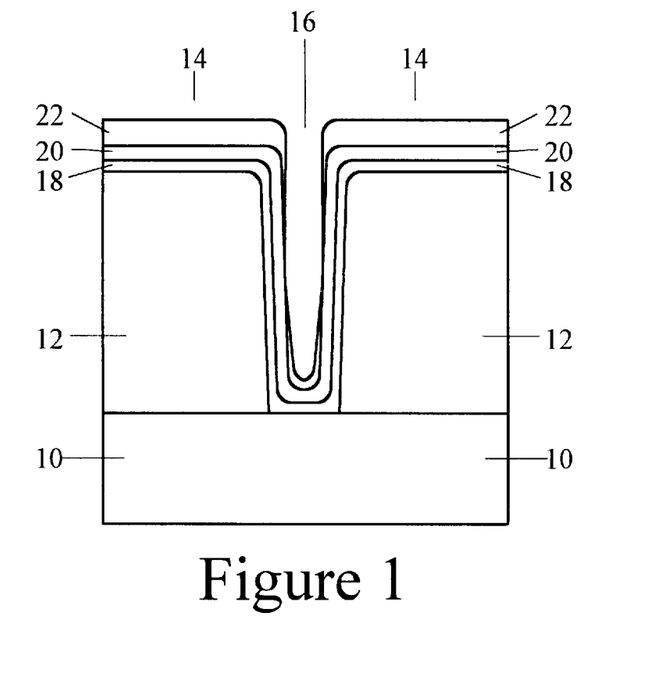
FIG. 1 shows a cross-sectional view of an inventive structure formed in accordance with a preferred embodiment of the present invention wherein a first, conformal seed layer is deposited over a barrier layer, followed by a second, non-conformal seed layer deposited over the first, conformal seed layer.

FIG. 1 shows a cross-sectional view of an inventive structure formed in accordance with a preferred embodiment of the present invention wherein a first, conformal seed layer is deposited over a barrier layer, followed by a second, non-conformal seed layer deposited over the first, conformal seed layer. The conformal seed layer provides continuous and complete step coverage inside the openings, while the non-conformal seed layer provides a low resistance electrical path over the top surface (field) surrounding the openings to enable uniform plating across the substrate (or wafer). To enable the uniform plating, it is preferable that the thickness of the combined seed layers be at least about 1,000 Å on the field.

In accordance with the preferred embodiment of the, inventive method of the present invention, barrier layer 18 is deposited over the entire surface of wafer 10, including over patterned insulating layer 12 (having had opening 16 patterned therein in accordance with any one of a number of methods that are well known to those of ordinary skill in the art), using a conformal Chemical Vapor Deposition ("CVD") technique. Although the term barrier layer is used, it should be understood by those of ordinary skill in the art that the term barrier layer includes examples wherein: (a) the barrier layer acts both as an adhesion layer and as a barrier layer; (b) a barrier layer separate from an adhesion layer is used; and (c) a multiplicity of layers is used, some acting as adhesion layers, some acting as barrier layers, or some acting as both. Further, although the term wafer is used, this also includes the term substrate as it is used in the art. Still further, although the present invention is described in the context of opening 16, in practice, a multiplicity of openings are patterned and filled in accordance with the present invention.

Advantageously, in accordance with the present invention, the use of a CVD technique to deposit barrier layer 18 ensures substantially complete and continuous coverage of the bottom and sidewall surfaces inside opening 16. However, it is within the scope of the present invention that barrier layer 18 may also be deposited using a Physical Vapor Deposition ("PVD")technique that provides continuous bottom and sidewall coverage. In accordance with the present invention, barrier layer 18 may comprise, for example and without limitation, a material selected from Ta, $TaN_X$, Cr, $CrN_X$, Ti, $TiN_X$, W, $WN_X$, and other alloys containing one or more of these materials. Further, the thickness of barrier layer 18 can be in a range of about 30 Å to about 500 Å, and more preferably in a range of about 50 Å to about 300 Å. Since barrier layer 18 occupies a certain fraction of interconnects formed in.accordance with the present invention, and since barrier layer 18 has a relatively large resistivity, its thickness should be minimized. However, the thickness of barrier layer 18 should be sufficiently large to mitigate copper out-diffusion and to provide complete bottom and sidewall coverage inside opening 16. Many CVD techniques and PVD techniques are well known to those of ordinary skill in the art for forming barrier layer 18.

Next, conformal seed layer 20 is deposited over barrier layer 18. Conformal seed layer 20 can be preferably deposited by using a CVD technique, but it can also be deposited by using an electroless technique or any other substantially conformal deposition technique. Many CVD techniques and electroless techniques are well known to those of ordinary skill in the art for forming conformal seed layer 20. The thickness of conformal seed layer 20 can be in a range of about 50 Å to about 500 Å, and more preferably in a range of about 100 Å to about 300 Å. Finally, non-conformal seed layer 22 is deposited over conformal seed layer 20. Non-conformal seed layer 22 can be preferably obtained using a PVD technique. Many PVD techniques are well known to those of ordinary skill in the art for forming non-conformal seed layer 22. The thickness of non-conformal seed layer 22 can be in a range of about 100 Å to about 3,000 Å, and more preferably in a range of about 500 Å to about 1,800 Å (in the field).

In accordance with the present invention, the conformal and non-conformal seed layers may comprise the same material, or they may comprise different materials. Although copper is commonly used as a seed layer, a highly conductive silver (Ag) layer can also be used. In fact, Ag has lower resistivity than that of Cu and, therefore,can be formed with a smaller thickness than that required when using Cu. Thus, conformal seed layer 20 and non-conformal seed layer 22 may comprise, for example, a material selected from Cu, Ag, or alloys comprising one or more of these metals.

Due to the non-directional, isotropic nature of CVD deposition techniques, the thickness of the CVD layers is substantially uniform over the entire surface (i.e., conformal), including over field 14, and over bottom and sidewall surfaces inside opening 16. In reality, however, even the best conformal CVD layers are thicker over the field than inside the openings. In fact, it is quite common for CVD Cu seed layers inside openings to have a thickness of about 80% of that over the field. In addition, the thickness of a CVD barrier layer inside the openings is typically only about 50% of that over the field. Thus, even the best CVD layers exhibit some overhang at the top corners of the openings.

EXAMPLE 1

The following presents an example of a preferred embodiment of the inventive method for 0.18 $\mu$m wide vias or trenches. In accordance with the preferred embodiment, one deposits, by a CVD technique,sa barrier layer comprised of about 200 Å of $TaN_x$, or $WN_x$, then one deposits, by a CVD technique, a conformal seed layer comprised of about 300 Å of Cu, finally one deposits, by a PVD technique, a non-conformal seed layer comprised of about 900 µ of Cu (as measured on the field). This will result in a total combined (including the barrier) thickness of about 400 Å inside the openings: {Cu(PVD)~50 Å)/Cu(CVD~250 Å)/$TaN_x$ (CVD~100 Å)} and a total combined Cu seed layer and barrier layer thickness of about 1,400 Å on the field: {Cu(PVD~900 Å)/Cu(CVD~300 Å)/$TaN_x$(CVD~200 Å}. Advantageously, in accordance with the present invention, the inventive "two-step" seed layer deposition ensures a continuous seed layer having excellent step coverage, and a low-resistance electrical path on the field to ensure uniform copper plating across the wafer. It may be noted that although the combined thickness of the copper seed layers inside the openings is only about 300 Å, due to the very short distance to the field (typically about 1 µm), a voltage drop from the field to the inside of the openings is negligible. Thus, the thickness of the "two-step" seed layer inside the openings is adequate for copper plating therein. In fact, if necessary, the thickness of the "two-step" seed layer inside the openings can be further decreased (to a range from about 100 Å to about 200 Å) to enable void-free copper filling of even smaller openings (for example, below 0.10–0.13 µm). In the above example, the combined thicknesses of the barrier and seed layers at the sidewalls of the openings is about 400 Å on each side, thus occupying about 800 Å of the 1,800 Å opening. This leaves enough room (~1,000 Å) to facilitate electroplating inside the opening without sealing or pinching-off of the top corners.

After depositing seed layers 20 and 22 shown in FIG. 1, substrate 10 is placed in a copper electroplating bath, and electroplating is carried out in accordance with any one of a number of methods that are well known to those of ordinary skill in the art to deposit a thickness of copper sufficient to fill patterned opening 16, with some excess, and to cover field 14 surrounding opening 16. Finally, excess plated copper overlying opening 16 and overlying field 14, as well as seed layers 20 and 22 and barrier layer 18 overlying field 14, are removed using any one of a number of techniques that are well known to those of ordinary skill in the art, for example, using a mechanical polishing or a chemical mechanical polishing (CMP) technique. Other removal techniques, such as wet or dry etching techniques may also be used to remove excess plated copper overlying opening 16 and field 14, and to remove seed layers 20 and 22 and barrier metallic layer 18 overlying field 14. It should be clear to those of ordinary skill in the art that removal may also be accomplished using a combination of techniques, including those identified above.

Although the detailed description above refers to filling opening 16 by electroplating copper, it is within the scope of the present invention to electrofill opening 16 with any low resistivity material, such as a material selected from Cu, Ag, or an alloy comprising one or more of these metals. In fact, silver (Ag) has lower resistivity than that of Cu, and may be attractive for further reducing the dimensions of the interconnects.

Figure 2:
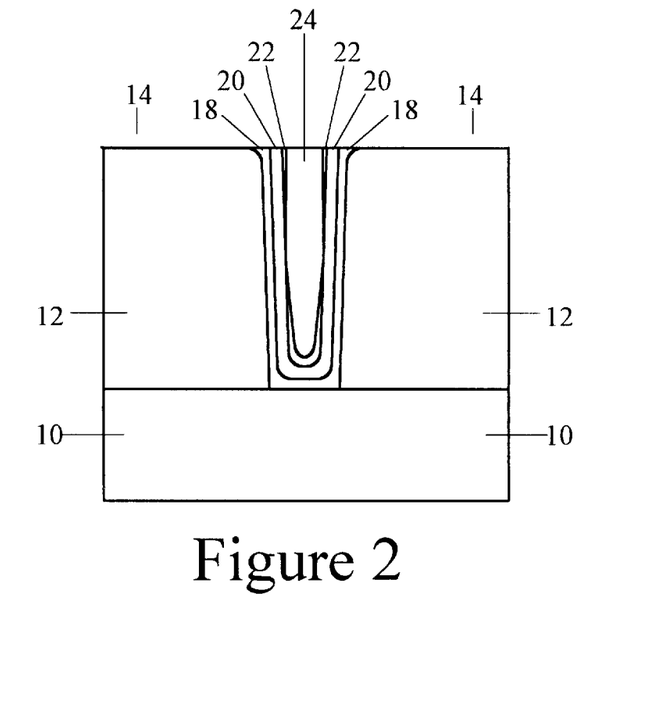
FIG. 2 shows a cross-sectional view of the inventive structure of FIG. 1 after removing excess plated copper or silver overlying an opening and the field, as well as removing the seed layers and barrier layer overlying the field surrounding the opening.

FIG. 2 shows a cross-sectional view of the inventive structure of FIG. 1 after removing excess plated copper (or silver) 24 overlying opening 16 and field 14, and removing seed layers 20 and 22 and barrier layer 18 overlying field 14 surrounding opening 16. FIG. 2 illustrates the filling of openings (trenches and vias) with electroplated copper (or silver) 24, as well as the lining of the bottom and sidewall surfaces of opening 16 by barrier layer 18 and seed layers 20 and 22. As shown in FIG. 2, all metallic layers were removed from field 14 of insulating layer 12 which surrounds embedded electroplated copper (or silver) interconnect 24.

Figure 3:
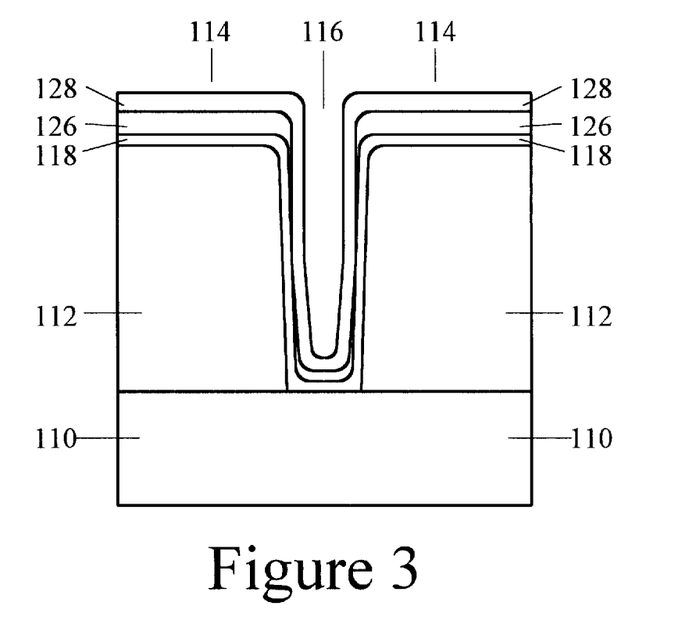
FIG. 3 shows a cross-sectional view of an inventive structure formed in accordance with an alternative embodiment of the present invention wherein a first, non-conformal seed layer is deposited over a barrier layer, followed by a second, conformal seed layer deposited over the first, non-conformal seed layer.

FIG. 3. shows a cross-sectional view of an inventive structure, formed in accordance with an alternative embodiment of the present invention wherein a first, non-conformal seed layer is deposited over a barrier layer, followed by a second, conformal seed layer deposited over the first, non-conformal seed layer. The non-conformal seed layer provides a low resistance electrical path over the top surface (field) surrounding the openings to enable uniform plating across the substrate (or wafer), while the conformal seed layer provides continuous and complete step coverage inside the openings.

In accordance with.the alternative embodiment of the inventive method of the present invention, barrier layer 118 is deposited over the entire surface of wafer 110, including over patterned insulating layer 112 (having had opening 116 patterned therein in accordance with any one of a number of methods that are well known to those of ordinary skill in the art), using a conformal Chemical Vapor Deposition ("CVD")technique.

Although the term barrier layer is used herein, it should be understood by those of ordinary skill in the art that the term barrier layer includes examples wherein: (a) the barrier layer acts both as an adhesion layer and as a barrier layer; (b) a barrier layer separate from an. adhesion layer is used; and (c) a multiplicity of layers is used, some acting as adhesion layers, some acting as barrier layers, or some acting as both. Further, although the term wafer is used, this also includes the term substrate as it is used in the art. Still further, although the present invention is described in the context of opening 116, in practice, a multiplicity of openings are patterned and filled in accordance with the present invention.

Advantageously, in accordance with the present invention, the use of a CVD technique to deposit barrier layer 118 ensures complete and continuous coverage of the bottom and sidewall surfaces inside opening 116. However, it is within the scope of the present invention that barrier layer 118 may also be deposited using a Physical Vapor Deposition ("PVD")technique that provides continuous bottom and sidewall coverage. In accordance with the present invention, barrier layer 118 may comprise, for example and without limitation, a material selected from Ta, $TaN_x$, Cr, $CrN_x$, Ti, $TiN_x$, W, $WN_x$, and other alloys containing one or more of these materials. Further, the thickness of barrier layer 118 can be in a range of about 30 Å to about 500 Å, and more preferably in a range of about 50 Å to about 300 Å. Since barrier layer 118 occupies a certain fraction of interconnects formed in accordance with the present invention, and since barrier layer 118 has a relatively large resistivity, its thickness should be minimized. However, the thickness of barrier layer 118 should be sufficiently large to mitigate copper out-diffusion and to provide complete bottom and sidewall coverage inside opening 116. Many CVD techniques and PVD techniques are well known to those of ordinary skill in the art for forming barrier layer 118.

Next, non-conformal seed layer 126 is deposited over barrier layer 118. Non-conformal seed layer 126 can be preferably obtained using a PVD technique. Many PVD techniques are well known to those of ordinary skill in the art for forming non-conformal seed layer 126. The thickness of non-conformal seed layer 126 can be in a range of about 100 Å to about 3,000 Å, and more preferably in a range of about 500 Å to about 1,800 Å (on the field). Finally, conformal seed layer 128 is deposited over non-conformal seed layer 126. Conformal seed layer 128 can be preferably obtained using a CVD or electroless technique or any other substantially conformal deposition technique. Many CVD techniques and electroless techniques are well known to those of ordinary skill in the art for forming conformal seed layer 128. The thickness of conformal seed layer. 128 can be in a range of about 50 Å to about 500 Å, and more preferably in a range of about 100 Å to about 300 Å.

In accordance with the present invention, the conformal and non-conformal seed layers may comprise the same material, or they may comprise different materials. Although copper is commonly used as a seed layer, a highly conductive silver (Ag) layer can also be used. Non-conformal seed layer 126 and conformal seed layer 128 may comprise, for example, a material selected from Cu, Ag, or alloys comprising one or more of these metals.

After depositing seed layers 126 and 128 shown in FIG. 3, substrate 110 is placed in a copper electroplating bath and electroplating is carried out in accordance with any one of a number of methods that are well known to those of ordinary skill in the art to deposit a thickness of copper sufficient to fill patterned opening 116, with some excess, and to cover field 114 surrounding opening 116. Finally, excess plated copper overlying opening 116 and field 114 of insulating layer 112, as well as seed layers 126 and 128 and barrier layer 118 overlying field 114, are removed using any one of a number of techniques that are well known to those of ordinary skill in the art, for example, using a mechanical polishing or a chemical mechanical polishing (CMP) technique. Other removal techniques, such as wet or dry etching techniques may also be used to remove excess plated copper overlying opening 116 and field 114, and to remove seed layers 126 and 128 and barrier layer 118 overlying field 114. It should be clear to those of ordinary skill in the art that removal may also be accomplished using a combination of techniques, including those identified above.

Although the detailed description above refers to filling opening 116 by electroplating copper, it is within the scope of this invention to electrofill opening 116 with any low resistivity material, such as a material selected from Cu, Ag, or alloys comprising one or more of these metals. In fact, silver (Ag) has lower resistivity than that of Cu, and may be attractive for further reducing the dimensions of the interconnects.

Figure 4:
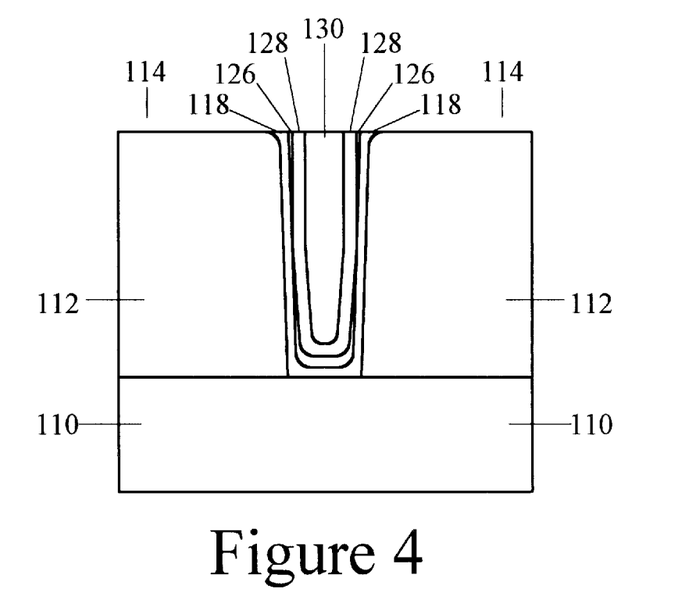
FIG. 4 shows a cross-sectional view of the inventive structure of FIG. 3 after removing excess plated copper or silver overlying an opening and the field, as well as removing the seed layers and barrier layer overlying the field surrounding the opening.

FIG. 4 shows a cross-sectional view of the inventive structure of FIG. 3 after removing excess electroplated copper (or silver) 130 overlying opening 116 and field 114, and removing seed layers 126 and 128 and barrier layer 118 overlying field 114 surrounding opening 116. FIG. 4 illustrates the filling of openings (trenches and vias) with electroplated copper (or silver) 130, as well as the lining of the bottom and sidewall surfaces of opening 116 by barrier layer. 118 and seed layers 126 and 128. As shown in FIG. 4, all metallic layers were removed from field 114 of insulating layer 112 which surrounds embedded electroplated copper (or silver) interconnect 130.

EXAMPLE 2

Figure 5:
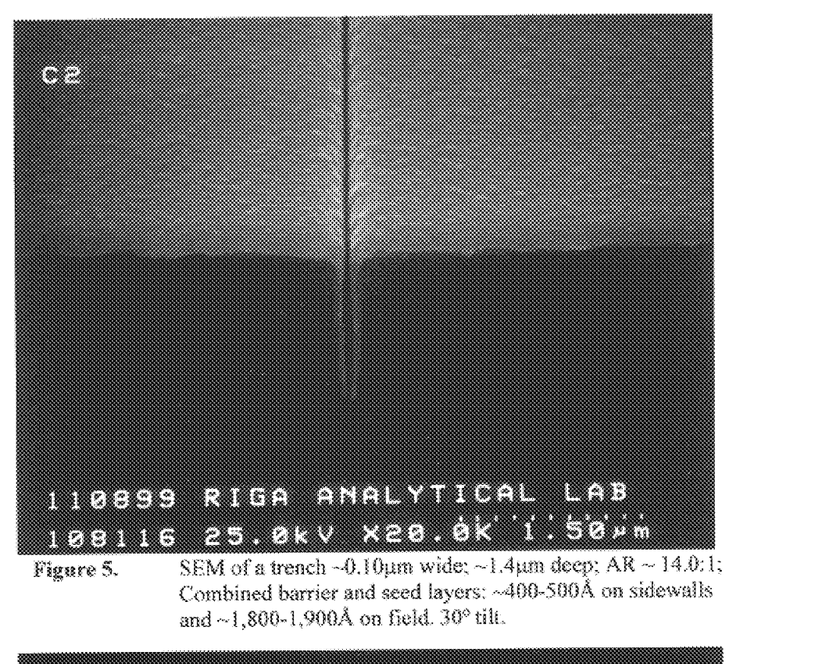
FIG. 5. shows a scanning electron microscope ("SEM") photograph of a cleaved cross-section (with a tilt angle of 30°) of a trench (the trench is ~0.01 $\mu$m wide, ~1.4 $\mu$m deep, and has.an aspect ratio of ~14:1) having seed layers formed in accordance with one embodiment of the present invention.
Figure 6:
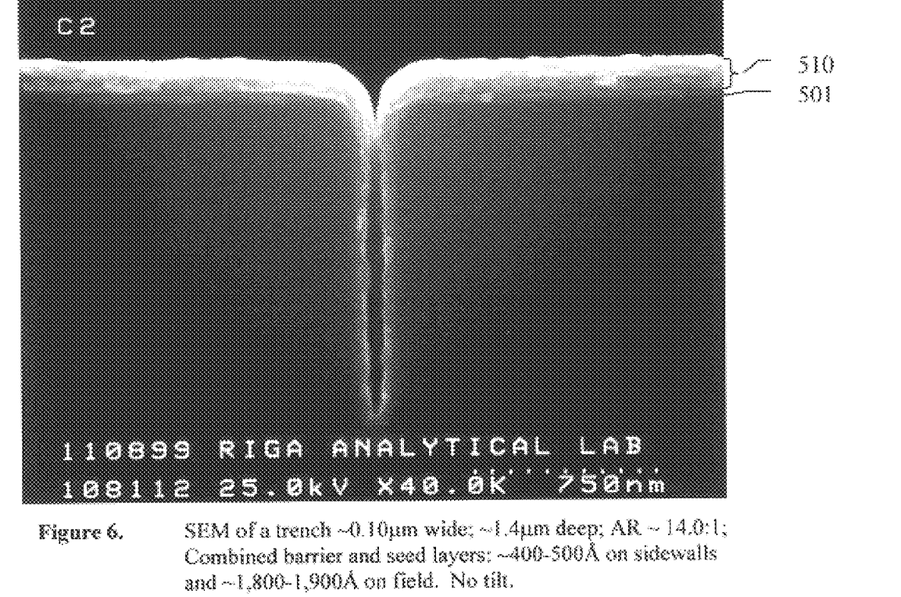
FIG. 6 shows an SEM photograph of the trench shown in FIG. 5 without a tilt, and with a larger enlargement.

FIGS. 5 and 6 show scanning electron microscope ("SEM") photographs of a cross-section of a 0.10 μm wide trench having a Cu seed layer prepared in accordance with a preferred embodiment of the invention. In accordance with this embodiment, a pattern of trenches was formed in a $SiO_2$ insulating layer. The trenches were about 0.10 μm wide and about 1.4 μm deep (thereby having an aspect ratio of about 14:1). Next, a barrier layer ($WN_x$) was deposited using a CVD technique. Next, a relatively thin, conformal Cu seed layer was deposited using a CVD technique. The barrier layer and thin, conformal Cu seed layer is seen at 501 in FIG. 6. In accordance with this embodiment, the combined thickness of the barrier and the CVD Cu seed layer was about 500 Å on the field, and about 400–500 Å on the sidewalls and bottom of the trenches. Next, a non-conformal PVD Cu seed layer having a thickness of about 1,400 Å (on the field) was deposited by sputtering.

In this embodiment, the non conformal PVD Cu seed layer was applied in two steps and is seen at 510 in FIG. 6. The end result, as shown in FIGS. 5 and 6, was a combined thickness (including the barrier and the Cu seed layers) of only about 400–500 Å on the sidewalls and bottom of the trench (with excellent continuity and uniformity there), and about 1,900 Å on the field, without pinching-off of the trench. One should note that, while FIG. 5 shows the cross-section with a tilt of about 30° and an enlargement of 20,000×(thus providing also a partial view of the top surface), FIG. 6 shows the same cross-section with an enlargement of 40,000× and without a tilt.

EXAMPLE 3

Similar to Example 2 above, trenches ~0.10 μm wide and ~1.4 μm deep (thereby having an aspect ratio of ~14:1) were formed in a $SiO_2$ insulating layer. Next, a barrier layer ($WN_x$) was deposited using a CVD technique. Next, a relatively thin, conformal Cu seed layer was deposited using a CVD technique. The combined thickness of the barrier layer and the CVD Cu layer was ~500 Å on the field, and ~400–500 Å on the sidewalls and bottom of the trenches. Next, a non-conformal PVD Cu seed layer having a thickness of ~500 Å (on the field) was deposited by sputtering. The end result was a combined thickness (including the barrier layer and the Cu seed layers) of only about 400–500 Å on the sidewalls and bottom of the trenches (with excellent continuity and uniformity), and about 1,000 Å on the field, without pinching-off the trenches.

It should be understood that the scope of the present invention is not limited to the embodiments described above with respect to FIG. 1 and FIG. 3. For example, in accordance with further embodiments of the present invention, a relatively thin ("Flash") PVD seed layer can be deposited first, followed by a conformal CVD or electroless seed layer, and finally followed by a (relatively thick) PVD seed layer to produce three separately deposited seed layers.

Adhesion of a metallo-organic CVD (MOCVD) deposited Cu seed layer to underlying barrier layer is rather poor, and may not be adequate for use in devices when chemical mechanical polishing (CMP) processing follows Cu plating. In addition, when an MOCVD Cu layer is deposited directly over a barrier layer containing a refractory metal, further problems arise. In particular, the morphology, uniformity, and electrical resistivity of the MOCVD Cu layer may not be adequate for use in devices. It is believed that these problems are due to the high affinity of the refractory metal in the barrier layer to oxygen and/or carbon atoms. Specifically, during the initial:stages of MOCVD Cu deposition, the refractory metal of the barrier layer spontaneously reacts with carbon or oxygen containing species (from the organic part of the metallo-organic compound) to form an oxide, carbide, or a mixed oxide-carbide interfacial layer between itself and the depositing Cu. Such an intermediate layer adversely impairs the adhesion of the MOCVD Cu layer. Cu (as well as other noble metals) does not adhere well to oxide or carbide layers, and requires a clean metal-to-metal bond in order to adhere well to another metal. Similarly, the oxide, carbide, and/or oxide-carbide interfacial layer impairs proper nucleation of the MOCVD Cu on the refractory metal barrier layer. This adversely affects the morphology, uniformity, and resistivity of the deposited MOCVD Cu seed layer.

In accordance with one embodiment of the present invention, at least an initial stage of CVD Cu deposition is carried.out utilizing high purity, inorganic Cu compounds (precursors), such as, for example and without limitation, chlorides or fluorides, which do not contain oxygen or carbon atoms. The resulting clean metal-to-metal interface between a barrier layer containing a refractory metal and the depositing copper ensures good adhesion, morphology, uniformity, and low electrical resistivity of the CVD Cu layer. In a further embodiment, the entire CVD Cu layer can be deposited using the inorganic precursors. In a still further embodiment, only the initial stage of the CVD Cu is carried out using inorganic precursors, switching later to an MOCVD Cu deposition process, to form the rest of the CVD Cu layer.

In accordance with a still further embodiment of the present invention that solves the problems involved with the deposition of an MOCVD Cu layer on a barrier layer containing a refractory metal, a first, relatively thin, "Flash" PVD seed layer is deposited to enhance adhesion to the barrier layer and/or to improve grain morphology and uniformity of a subsequently deposited CVD seed layer.

Exposure of wafers to the atmosphere during transport from one deposition chamber to another may cause deleterious oxidation and/or contamination of the surface of barrier and/or seed layers. Such exposure should, therefore, be avoided or minimized.

In accordance with one embodiment of the present invention, conformal and non-conformal seed layers are deposited in an apparatus where the conformal and non-conformal seed layer deposition steps can be carried out without breaking vacuum, or without exposing the wafer to the atmosphere between the deposition steps. In accordance with this embodiment, the apparatus may comprise two or more chambers, at least one chamber for deposition of the conformal seed layer, and at least another chamber for deposition of the non-conformal seed layer. In a preferred embodiment of the present invention, the apparatus further comprises a chamber for deposition of the barrier layer, preferably by a CVD technique. The barrier layer may be deposited in a separate chamber or it may be deposited in one of the chambers used to deposit either the conformal, or the non-conformal, seed layers.

Figure 7:
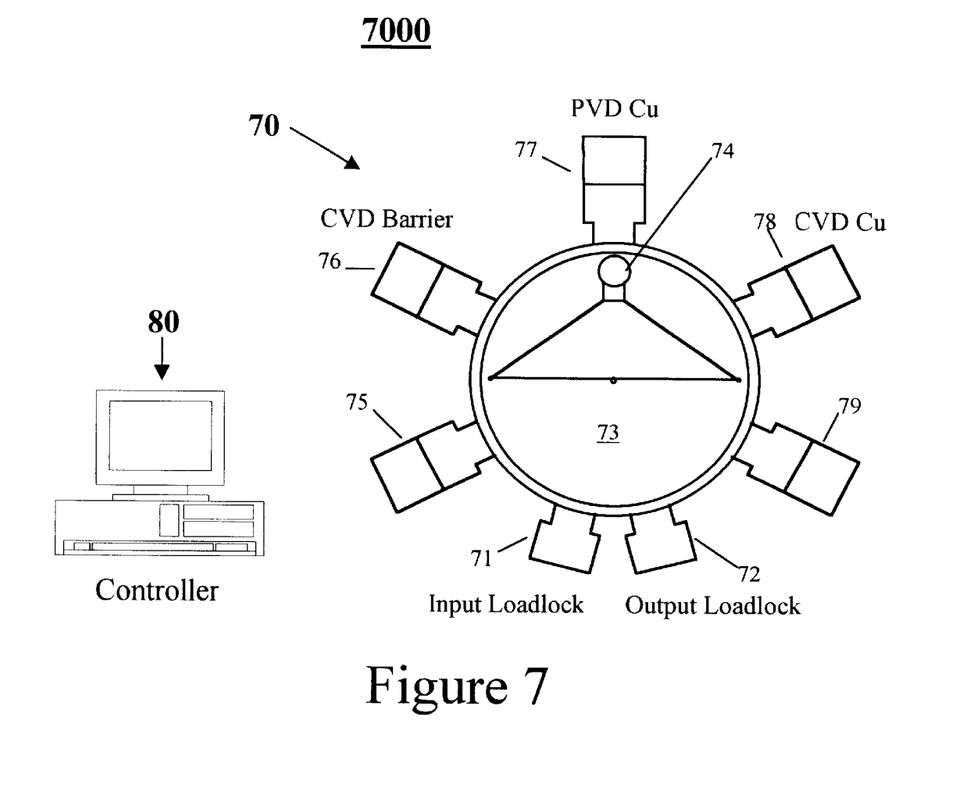
FIG. 7 shows a schematic (not to scale) top, view of a cluster tool apparatus, and a frontal view of its controller (e.g. computer), in accordance with a preferred embodiment of the invention.

FIG. 7 shows apparatus 7000 that is fabricated in accordance with a preferred embodiment of the invention: As shown in FIG. 7, apparatus 7000 comprises cluster tool 70 which operates in accordance with input from controller 80 in a manner that is well known to those of ordinary skill in the art. As further shown in FIG. 7, cluster tool 70 includes input loadlock 71 and output loadlock 72. As is well known to those of, ordinary skill in the art, loadlocks 71 and 72 enable wafers to be inserted into and removed from cluster tool 70, respectively. Although FIG. 7 shows separate input and output loadlocks, it is also within the spirit and scope of the present invention to use a single loadlock for both input and output of wafers.

As is well known to those of ordinary skill in the art, once wafer 74 is inserted into transfer chamber 73 of cluster tool 70, it can be transferred between the various processing chambers (for example, processing chambers 75–79) without breaking vacuum, or without exposure to the atmosphere. As is shown in FIG. 7, cluster tool 70 comprises CVD barrier layer deposition chamber 76, PVD Cu seed layer deposition chamber 77, and CVD Cu seed layer deposition chamber 78. In addition, FIG. 7 shows several other processing, for example, processing chambers 75 and 79, which can be used for other processing steps that are well known to those of ordinary skill in the art, such as pre-cleaning, cooling, or as extra deposition chambers. Although FIG. 7 shows separate CVD chambers for depositing a barrier layer and Cu seed layers, it is also within the scope of the invention to deposit both types of layers in the same CVD chamber.

Controller 80 is apparatus which is well known to those of ordinary skill in the art that is used to control the operation of cluster tool 70. As such, controller 80 determines the sequence and duration of movements and stays of wafer 74: (a) to and from loadlocks 71 and 72; and (b) to and from the various processing chambers 75–79. As is also well known to those of ordinary skill in the art, controller 80 controls the specific process sequence and process parameters for operation of the various ones of processing chambers 75–79, sometimes referred to in the art as "recipes" For example, in PVD Cu seed layer deposition chamber 77, among other things, controller 80 controls the duration of the sputter deposition, the background pressure, the sputtering gas (such as Argon) pressure pressure and flow rate, the cathodic voltage and power, and/or bias voltage applied to the wafer. Lastly, as is also well known to those of ordinary skill in the art, controller 80 performs these functions in accordance with specific recipes which are data structures that dictate the operation of controller 80 software. The data structures are typically stored on computer readable media that are input to controller 80 under the control of operation software, which operation software itself is typically stored on a computer readable medium. In accordance with a preferred embodiment of the present invention, recipes are input to controller 80 to cause it to control cluster tool 70 to process wafers in the manner described above to deposit a Cu barrier layer and Cu seed layers without breaking vacuum or exposing a wafer to the atmosphere.

In one embodiment of the present invention, the apparatus comprises a chamber in which both conformal and non-conformal seed layers are deposited utilizing: (a) two or more distinct steps, wherein the deposition variables (or conditions or parameters) during the first step are suitable for the deposition of a substantially conformal (or a non-conformal) seed layer, and the deposition conditions during the second step are suitable for the deposition of a substantially non-conformal (or a conformal) seed layer; (b) wherein at least one of the deposition variables is varied (or ramped) continuously or gradually, thereby changing the nature of the seed layer from substantially conformal to substantially non-conformal, or vice versa; or (c) a combination of at least one distinct step of depositing a substantially conformal (or a non-conformal) seed layer and at least one gradual variation (or ramping) of at least one deposition variable towards a substantially non-conformal (or a conformal) seed layer, and vice versa.

As is well known to those of ordinary skill in the art, the nature of certain deposition techniques, such as ion plating or other PVD techniques, can be made more conformal, or less conformal, by varying the deposition parameters (or variables, or conditions). For example, increasing the (partial) pressure during ion plating and other PVD techniques, tends to increase scattering of the depositing atoms (or ions), thereby making the deposition more isotropic and conformal. Similarly, biasing the substrate has an effect on the nature of the deposit. For example, in ionized metal plasma (IMP) and ion plating, increasing the (negative) bias voltage further accelerates positive ions (of the depositing metal) towards the substrate, thereby improving the filling of small openings. At the same time, the higher (negative) bias also increases the removal rate (or back-sputtering) from the top corners of the openings and the field, thereby rendering the deposition to be more conformal. Conversely, decreasing the negative bias, or even using positive bias, can render the deposition to be less conformal. Deposition rate (or power density) can also affect the nature of the deposition.

Similarly, as is known to those of ordinary skill in the art, the nature of certain CVD techniques can be made less conformal, or more conformal, by changing the deposition variables. For example, increasing the substrate temperature tends to shift the deposition from a surface-reaction, rate-controlled deposition at low temperature, to a transport, rate-controlled deposition at higher temperature. As a result, increasing the substrate temperature tends to render the deposition to be less conformal. Conversely, decreasing the temperature, tends to render the deposition to be more conformal. Similarly, increasing the precursor and/or the reacting gas partial pressure (or flow rate) tends to shift the deposition to be a more surface-reaction, rate-controlled deposition, thereby tending to render the deposition to be more conformal. Conversely, decreasing the partial pressure and/or flow rate of the precursor and/or a reacting gas, tends to render the deposition to be a more transport, rate-controlled deposition and, therefore, less conformal. The plasma variables in PECVD, such as the power density, may also have significant effects on the nature of the deposition.

In accordance with one embodiment of the present invention, cluster tool 70 comprises the following chambers: a CVD deposition chamber for depositing a barrier layer (for example, Ta, $TaN_X$, W, or $WN_X$); a PVD deposition chamber for depositing a PVD Cu seed layer; and a CVD deposition chamber for depositing a CVD Cu seed layer. Single wafers are transferred in-situ in cluster tool 70, from one chamber to another, without exposing the wafers to the atmosphere prior to the deposition of the top Cu seed layer. The CVD barrier and the CVD Cu seed layers can be deposited in the same CVD chamber by using different gases and chemistries for the respective layers. However, a separate CVD chamber for each layer (i.e., the barrier and the CVD Cu layers) is preferred in order to minimize cross-contamination. Using cluster tool 70, cluster tool controller 80 would cause a deposition process such as the following to be, carried out in accordance with a recipe specified, for example in the form of a data structure or software or program code: (a) (in accordance with a first portion of the data structure or a first portion of the software or computer code) introducing wafer 74 into CVD barrier layer deposition chamber 76 and depositing on wafer 74 a CVD barrier layer (about 200–400 Å thick) comprising $TaN_X$ or $WN_X$; (b) (in accordance with a second portion of the data structure or a first portion of software or computer code) transferring wafer 74 through transfer chamber 73, without exposing wafer 74 to the atmosphere, to PVD Cu seed layer deposition chamber 77 and depositing on wafer 74 a relatively thin (about 100–500 Å) "Flash" PVD Cu layer; (c) (in accordance with a third portion of the data structure or a first portion of software or computer code) transferring wafer 74 through transfer chamber 73, without exposing wafer 74 to the atmosphere, to CVD Cu seed layer deposition chamber 78 and depositing on wafer 74 a CVD Cu layer (about 100–500 Å thick); and (d) (in accordance with a fourth portion of the data structure or a first portion of software or computer code) transferring wafer 74 through transfer chamber 73, without exposing it to the atmosphere, to PVD Cu seed layer deposition chamber 77 and depositing on wafer 74 a relatively thick PVD Cu layer (about 500–1,800 Å thick). Other, ancillary steps include introducing wafer 74 into and removing wafer 74 from cluster tool 70 through loadlocks 71 and 72, respectively.

Another embodiment of a three-step combination may include a first deposited CVD seed layer, followed by a relatively thick PVD seed layer, and finally followed by a second deposited CVD seed layer. Other combinations may comprise even more steps in the deposition of the seed layer. In this embodiment, the three (or more) separately deposited seed layers may comprise the same metal or alloy or they may comprise, for example and without limitation, different materials chosen from Cu, Ag, or alloys comprising one or more of these metals.

Those skilled in the art will recognize that the foregoing description has been presented for the sake of illustration and description only. As such, it is not intended to be exhaustive or to limit the invention to the precise form disclosed.

What is claimed is:

1. An apparatus for depositing seed layers on a substrate, said substrate comprising narrow openings surrounded by a field, said apparatus comprising:

at least one conformal deposition chamber adapted to deposit a substantially conformal seed layer on the substrate;

at least one non-conformal deposition chamber adapted to deposit a substantially non-conformal seed layer on the substrate, wherein said seed layers comprise a material selected from a group consisting of Cu, Ag, or alloys comprising one or more of these metals; and a controller which includes recipe information, said recipe information includes deposition sequence and process parameters for operation of the deposition chambers, wherein the controller, in response to the recipe information, causes the conformal deposition chamber to deposit said substantially conformal seed layer having a thickness of about 50 Å to about 500 Å on the field and causes the non-conformal deposition chamber to deposit said substantially non-conformal seed layer having a thickness of about 100 Å to about 3,000 Å on the field, said controller causes the stopping of the deposition of said substantially conformal seed layer and causes the stopping of the deposition of said substantially non-conformal seed layer prior to filling the openings, thereby leaving enough room for electroplating inside the narrow openings.

2. The apparatus of claim 1 wherein said at least one conformal deposition chamber comprises a CVD seed chamber and said at least one non-conformal deposition chamber comprises a PVD seed chamber.

3. The apparatus of claim 2 which further comprises a transfer chamber adapted to transfer the substrate from said CVD seed chamber to said PVD seed chamber, and vice versa, without exposing the substrate to atmosphere.

4. The apparatus of claim 3 which further comprises a transfer chamber adapted to transfer the substrate from said CVD seed chamber to said PVD seed chamber, and vice versa, without breaking vacuum.

5. The apparatus of claim 2 further comprising a barrier chamber adapted to deposit a barrier layer.

6. The apparatus of claim 5 wherein said barrier layer comprises a material selected from the group consisting of Ta, $TaN_X$, Cr, $CrN_X$, Ti, $TiN_X$, W, $WN_X$, and other alloys containing one or more of these materials.

7. The apparatus of claim 5 wherein said barrier chamber comprises a CVD deposition chamber.

8. The apparatus of claim 5 wherein said barrier chamber comprises a PVD deposition chamber.

9. The apparatus of claim 2 wherein the CVD seed chamber is further adapted to deposit a CVD barrier layer.

10. The apparatus of claim 2 wherein the PVD seed chamber is further adapted to deposit a PVD barrier layer.

11. The apparatus of claim 1 wherein said controller further includes operation software which inputs the recipe information into the controller from a computer readable memory comprising data structures for controlling the sequence, duration, and process parameters of the deposition chambers, said data structures cause the apparatus to transfer the substrate between the conformal deposition chamber and the non-conformal deposition chamber, or vice versa.

12. The apparatus of claim 1 wherein the thickness of said substantially conformal seed layer is in the range of about 100 Å to about 300 Å on the field and the thickness of said substantially non-conformal seed layer is in the range of about 500 Å to about 1,800 Å on the field.

13. The apparatus of claim 12 wherein said controller causes the deposition of said substantially conformal seed layer prior to the deposition of said substantially non-conformal seed layer.

14. The apparatus of claim 12 wherein said controller causes the deposition of said substantially non-conformal seed layer prior to the deposition of said substantially conformal seed layer.

15. The apparatus of claim 1 wherein said controller causes the deposition of said substantially conformal seed layer prior to the deposition of said substantially non-conformal seed layer.

16. The apparatus of claim 1 wherein said controller causes the deposition of said substantially non-conformal seed layer prior to the deposition of said substantially conformal seed layer.

17. The apparatus of claim 1 wherein the controller further includes operation software which inputs the recipe information into the controller from a computer readable memory comprising data structures for controlling the sequence, duration, and process parameters of the deposition chambers.

18. An apparatus for depositing seed layers on a substrate, said substrate comprising narrow openings surrounded by a field, said apparatus comprising:
   a deposition chamber adapted to deposit both a substantially conformal seed layer on the substrate and a substantially non-conformal seed layer on the substrate, wherein said seed layers comprise a material selected from a group consisting of Cu, Ag, or alloys comprising one or more of these metals; and
   a controller which includes recipe information, said recipe information includes deposition sequence and process parameters for operation of the deposition chamber, wherein the controller, in response to the recipe information, causes the deposition chamber to deposit said substantially conformal seed layer having a thickness of about 50 Å to about 500 Å on the field and causes the deposition chamber to deposit said substantially non-conformal seed layer having a thickness of about 100 Å to about 3,000 Å on the field, said controller causes the stopping of the deposition of said substantially conformal seed layer and causes the stopping of the deposition of said substantially non-conformal seed layer prior to filling the openings, thereby leaving enough room for electroplating inside the narrow openings.

19. The apparatus of claim 18 wherein the controller further includes operation software which inputs the recipe information into the controller from a computer readable memory comprising data structures for controlling the sequence, duration, and process parameters of said deposition chamber, said data structures cause the deposition chamber to deposit at least two seed layers, in at least two distinct steps in succession, wherein deposition parameters used in one of the distinct steps produce a substantially conformal seed layer and deposition parameters used in another distinct step produce a substantially non-conformal seed layer.

20. The apparatus of claim 19 wherein the controller causes at least one of the deposition parameters to be varied continuously or gradually, thereby changing gradually the nature of the depositing seed layer from a substantially conformal seed layer to a substantially non-conformal seed layer, or vice versa, inside the same deposition chamber.

21. The apparatus of claim 19 wherein the controller causes at least one of the deposition parameters to vary in a manner to provide a combination of at least one distinct step of depositing a substantially conformal or a non-conformal seed layer and at least one gradual variation of the at least one deposition parameter towards a substantially non-conformal or a conformal seed layer, respectively, or vice versa, inside the same deposition chamber.

22. The apparatus of claim 18 wherein said deposition chamber comprises a PVD chamber, and wherein said controller causes at least one deposition parameter selected from the group consisting of substrate bias, gas pressure, cathodic voltage, and power density to vary in a manner to deposit a substantially conformal seed layer on the substrate in one step and to deposit a substantially non-conformal seed layer on the substrate in another step.

23. The apparatus of claim 22 wherein said PVD chamber comprises an ion plating deposition chamber.

24. The apparatus of claim 22 wherein said PVD chamber comprises an ionized metal plasma (IMP) deposition chamber.

25. The apparatus of claim 22 wherein said at least one deposition parameter comprises substrate bias, and wherein the controller causes a higher (more negative) substrate bias during deposition of said substantially conformal seed layer and a lower (less negative) substrate bias during deposition of said substantially non-conformal seed layer.

26. The apparatus of claim 22 wherein said at least one deposition parameter comprises gas pressure, and wherein the controller causes a higher gas pressure during deposition of said substantially conformal seed layer and a lower gas pressure during deposition of said substantially non-conformal seed layer.

27. The apparatus of claim 18 wherein the thickness of said substantially conformal seed layer is in the range of about 100 Å to about 300 Å on the field and the thickness of said substantially non-conformal seed layer is in the range of about 500 Å to about 1,800 Å on the field.

28. The apparatus of claim 27 wherein said controller causes the deposition of said substantially conformal seed layer prior to the deposition of said substantially non-conformal seed layer.

29. The apparatus of claim 27 wherein said controller causes the deposition of said substantially non-conformal seed layer prior to the deposition of said substantially conformal seed layer.

30. The apparatus of claim 27 wherein said deposition chamber comprises a PVD deposition chamber.

31. The apparatus of claim 27 wherein said deposition chamber comprises a CVD deposition chamber.

32. The apparatus of claim 18 wherein said controller causes the deposition of said substantially conformal seed layer prior to the deposition of said substantially non-conformal seed layer.

33. The apparatus of claim 18 wherein said controller causes the deposition of said substantially non-conformal seed layer prior to the deposition of said substantially conformal seed layer.

34. The apparatus of claim 18 wherein said deposition chamber comprises a PVD deposition chamber.

35. The apparatus of claim 18 wherein said deposition chamber comprises a CVD deposition chamber.

36. The apparatus of claim 18 wherein said deposition chamber comprises a CVD chamber, said controller causes at least one deposition parameter selected from the group consisting of substrate temperature, precursor or reacting gas partial pressure (or flow rate), and plasma power density (in PECVD) to vary in a manner to deposit a substantially conformal seed layer on the substrate in one step and to deposit a substantially non-conformal seed layer on the substrate in another step.

37. The apparatus of claim 36 wherein said at least one deposition parameter comprises substrate temperature, and wherein said controller causes a higher substrate temperature during deposition of the substantially non-conformal seed layer and a lower substrate temperature during deposition of the substantially conformal seed layer.

38. The apparatus of claim 36 wherein said at least one deposition parameter comprises precursor partial pressure (or flow rate), and wherein said controller causes a higher precursor partial pressure (or flow rate) during deposition of the substantially conformal seed layer and a lower precursor partial pressure (or flow rate) during deposition of the substantially non-conformal seed layer.

39. An apparatus for depositing seed layers on a substrate, said substrate comprising narrow openings surrounded by a field, said apparatus comprising:

at least one conformal deposition chamber adapted to deposit a substantially conformal seed layer on the substrate;

at least one non-conformal deposition chamber adapted to deposit a substantially non-conformal seed layer on the substrate, wherein said seed layers comprise a material selected from a group consisting of Cu, Ag, or alloys comprising one or more of these metals; and means for controlling the deposition chambers, according to deposition sequence and process parameters, wherein said means for controlling causes the conformal deposition chamber to deposit said substantially conformal seed layer having a thickness of about 50 Å to about 500 Å on the field and causes the non-conformal deposition chamber to deposit said substantially non-conformal seed layer having a thickness of about 100 Å to about 3,000 Å on the field, said means for controlling causes the stopping of the deposition of said substantially conformal seed layer and causes the stopping of the deposition of said substantially non-conformal seed layer prior to filling the openings, thereby leaving enough room for electroplating inside the narrow openings.

40. An apparatus for depositing seed layers on a substrate, said substrate comprising narrow openings surrounded by a field, said apparatus comprising:

a deposition chamber adapted to deposit both a substantially conformal seed layer on the substrate and a substantially non-conformal seed layer on the substrate, wherein said seed layers comprise a material selected from a group consisting of Cu, Ag, or alloys comprising one or more of these metals; and means for controlling the deposition chamber according to deposition sequence and process parameters, wherein said means for controlling causes the deposition chamber to deposit said substantially conformal seed layer having a thickness of about 50 Å to about 500 Å on the field and causes the deposition chamber to deposit said substantially non-conformal seed layer having a thickness of about 100 Å to about 3,000 Å on the field, said means for controlling causes the stopping of the deposition of said substantially conformal seed layer and causes the stopping of the deposition of said substantially non-conformal seed layer prior to filling the openings, thereby leaving enough room for electroplating inside the narrow openings.

* * * * *

UNITED STATES PATENT AND TRADEMARK OFFICE
CERTIFICATE OF CORRECTION

PATENT NO. : 6,610,151 B1
APPLICATION NO. : 09/563733
DATED : August 26, 2003
INVENTOR(S) : Uri Cohen It is certified that error appears in the above-identified patent and that said Letters Patent is hereby corrected as shown below:

TITLE PAGE, ITEM (52)

Abstract:  Line 5, replace "oil" with --on--
Line 11, replace "me" with --are--

Col. 1, Line 37, delete "." after "As is"
Line 57, replace "barrier layer. is" with --barrier layer is--

Col. 2, Line 19, replace 'sight")nature' with --sight") nature--
Line 49, replace "surfacc&s" with --surfaces--

Col. 5, Line 18, replace "has.an" with --has an--
Line 43, delete "," at the end of the line Col. 6, Line 67, replace "sa" with --a--

Col. 7, Line 3, replace "technique,a" with --technique, a--
Line 4, replace "900 μ" with --900 Å--

Col. 8, Line 15, replace "with.the" with --with the--
Line 22, replace '("CVD")technique' with --("CVD") technique--
Line 27, delete "." after "an"
Line 42, replace '("PVD")technique' with --("PVD") technique--

Col. 9, Line 7, delete "." after "conformal seed layer"
Line 54, replace "layer. 118" with --layer 118--

Col. 10, Line 60, replace "initial:stages" with --initial stages--

Col. 11, Line 10, replace "carried.out" with --carried out--
Line 58, delete "," after "of"

Col. 12, Line 24, insert --.-- after "recipes"

UNITED STATES PATENT AND TRADEMARK OFFICE
CERTIFICATE OF CORRECTION

PATENT NO. : 6,610,151 B1
APPLICATION NO. : 09/563733
DATED : August 26, 2003
INVENTOR(S) : Uri Cohen It is certified that error appears in the above-identified patent and that said Letters Patent is hereby corrected as shown below:

Col. 13,        Line 7, replace "-ing.the." with -- -ing the--
                      Line 50, remove "," after "to be"
                      Line 51, replace "in.accordance" with --in accordance--

Signed and Sealed this

Fifteenth Day of January, 2008

JON W. DUDAS
*Director of the United States Patent and Trademark Office*